(12) United States Patent
Nakaya et al.

(10) Patent No.: US 12,080,521 B2
(45) Date of Patent: *Sep. 3, 2024

(54) PLASMA PROCESSING METHOD

(71) Applicant: Tokyo Electron Limited, Tokyo (JP)

(72) Inventors: Michiko Nakaya, Miyagi (JP); Yuya Minoura, Miyagi (JP); Taku Gohira, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/220,403

(22) Filed: Jul. 11, 2023

(65) Prior Publication Data

US 2023/0360891 A1 Nov. 9, 2023

Related U.S. Application Data

(63) Continuation of application No. 17/182,896, filed on Feb. 23, 2021, now Pat. No. 11,749,508.

(30) Foreign Application Priority Data

Feb. 25, 2020 (JP) .................. 2020-029071

(51) Int. Cl.
*H01J 37/32* (2006.01)
(52) U.S. Cl.
CPC ... *H01J 37/32449* (2013.01); *H01J 2237/332* (2013.01)

(58) Field of Classification Search
CPC ............ H01J 37/3244; H01J 37/32449; H01J 37/32192; H01J 37/32238; H01J 2237/332; H01J 2237/334
See application file for complete search history.

(56) References Cited

U.S. PATENT DOCUMENTS

| 5,834,371 | A | 11/1998 | Ameen et al. |
| 5,993,916 | A * | 11/1999 | Zhao ............... C23C 16/56 427/535 |
| 7,399,499 | B2 * | 7/2008 | Basceri ............ C23C 16/45561 427/248.1 |
| 8,177,990 | B2 | 5/2012 | Mochizuki et al. |
| 8,397,668 | B2 * | 3/2013 | Kobayashi ........ H01J 37/32082 156/345.43 |
| 9,928,994 | B2 | 3/2018 | Shaikh et al. |
| 2007/0077737 | A1 | 4/2007 | Kobayashi et al. |

(Continued)

FOREIGN PATENT DOCUMENTS

| JP | 04229619 A | 8/1992 |
| JP | H10172958 A | 6/1998 |

(Continued)

*Primary Examiner* — Tung X Le
(74) *Attorney, Agent, or Firm* — Nath, Goldberg & Meyer; Jerald L. Meyer; Tanya E. Harkins

(57) ABSTRACT

A method of processing a substrate with plasma includes: coating surfaces of components inside a chamber with a film having conductive properties by turning a first gas containing carbon and hydrogen into plasma inside the chamber; loading the substrate into the chamber; and processing the substrate by turning a second gas into plasma inside the chamber in a state where the surfaces of the components inside the chamber are coated with the film having conductive properties.

19 Claims, 5 Drawing Sheets

(56) References Cited

U.S. PATENT DOCUMENTS

| | | | |
|---|---|---|---|
| 2008/0178805 A1* | 7/2008 | Paterson | H01J 37/321 118/723 R |
| 2010/0043821 A1 | 2/2010 | Li et al. | |
| 2012/0223302 A1* | 9/2012 | Yukinobu | C09D 1/00 427/535 |
| 2013/0213575 A1 | 8/2013 | Kim et al. | |
| 2014/0187045 A1 | 7/2014 | Hua et al. | |
| 2015/0311043 A1* | 10/2015 | Sun | C23C 4/11 427/523 |
| 2018/0174870 A1* | 6/2018 | Yang | H01L 21/67069 |
| 2023/0039670 A1* | 2/2023 | Samulon | H01L 21/67103 |

FOREIGN PATENT DOCUMENTS

| | | |
|---|---|---|
| JP | 2006165093 A | 6/2006 |
| JP | 2009188257 A | 8/2009 |
| JP | 2016-086046 A | 5/2016 |
| JP | 2018133483 A | 8/2018 |

* cited by examiner

| Conditions | (1) | (2) | (3) | (4) | (5) |
|---|---|---|---|---|---|
| Gas type | $CH_4$ | $C_4F_8$ | $C_4F_6$ | $CH_4/C_4F_6$ | $CH_4/C_4F_8$ |
| D/R [nm/min] | 130 | 233 | 1000 | 1004 | 506 |
| Film thickness that can be deposited [nm] | 400 or less | ND | 2000 or more | ND | 2000 or less |
| E/R [nm/min] | 19 | ND | 102 | ND | 91 |

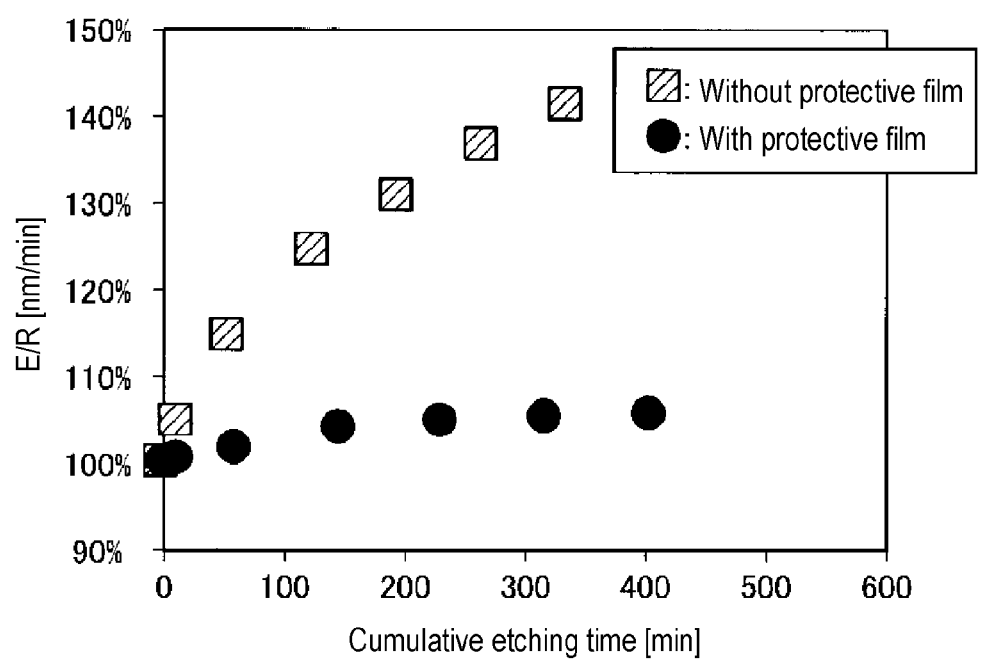

PLASMA PROCESSING METHOD

CROSS-REFERENCE TO RELATED APPLICATION

This is a Continuation Application of U.S. patent application Ser. No. 17/182,896, filed Feb. 23, 2021, an application claiming the benefit from Japanese Application No. 2020-029071, filed Feb. 25, 2020, the contents of each of which are hereby incorporated by reference in their entirety.

TECHNICAL FIELD

Various aspects and embodiments of the present disclosure relate to a plasma processing method.

BACKGROUND

When a process such as etching or the like is performed on a substrate with plasma generated inside a chamber, ions and radicals contained in the plasma collide with an inner wall of the chamber. This causes damage, such as scrape or erosion, to the inner wall of the chamber. In order to protect the inner wall of the chamber from such damage, there has been proposed forming a protective film on the inner wall of the chamber before performing plasma processing (see, e.g., Patent Document 1).

PRIOR ART DOCUMENT

Patent Document

Patent Document 1: Japanese Laid-Open Patent Publication No. 2016-86046

SUMMARY

According to one embodiment of the present disclosure, there is provided a method of processing a substrate with plasma, which includes: coating surfaces of components inside a chamber with a film having conductive properties by turning a first gas containing carbon and hydrogen into plasma inside the chamber; loading the substrate into the chamber; and processing the substrate by turning a second gas into plasma inside the chamber in a state where the surfaces of the components inside the chamber are coated with the film having conductive properties.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 8 is a diagram showing an example of a ratio of change in E/R with respect to E/R in an initial etching.

DETAILED DESCRIPTION

Hereinafter, embodiments of a plasma processing method will be described in detail with reference to the drawings. It should be noted that the following embodiments do not limit the disclosed plasma processing method. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Inside a chamber, there are electrodes that function as an anode and a cathode for plasma generated inside the chamber. In order to exchange electrons with the plasma, such electrodes need to have conductive properties with respect to the plasma.

However, if a protective film formed on an inner wall of the chamber is an insulating film, the conductive properties between the plasma and the electrodes may be lowered, which hinders the exchange of electrons with the plasma. As a result, the state of the plasma may be different from the state at the time of design. Therefore, the process becomes unstable and the difference between a process result and a desired result may increase.

Therefore, the present disclosure provides a technique capable of implementing process stabilization while suppressing consumption of internal components of a chamber.

[Configuration of Plasma Processing Apparatus 1]

Figure 1:
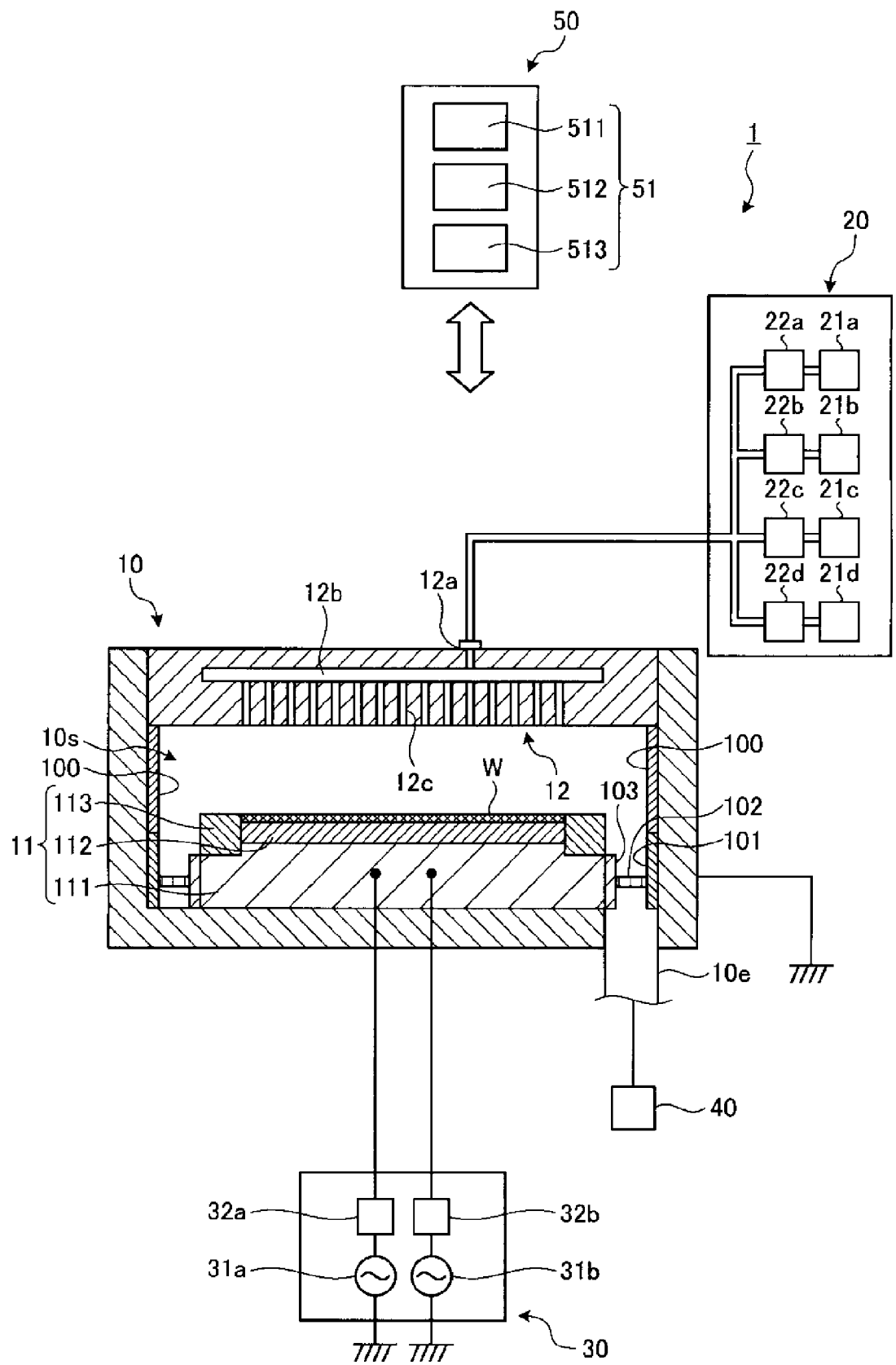
FIG. 1 is a schematic cross-sectional view showing an example of a plasma processing apparatus according to an embodiment of the present disclosure.

FIG. 1 is a schematic cross-sectional view showing an example of a plasma processing apparatus 1 according to an embodiment of the present disclosure. In the embodiment, the plasma processing apparatus 1 includes a chamber 10, a gas supply part 20, a radio frequency (RF) power supply part 30, an exhaust system 40, and a controller 50.

In this embodiment, the chamber 10 includes a support part 11 and an upper electrode shower head assembly 12. The support part 11 is disposed in a lower region of a processing space 10s inside the chamber 10. The upper electrode shower head assembly 12 is disposed above the support part 11 and can function as a portion of a ceiling plate of the chamber 10.

The chamber 10 is formed of, for example, a member such as aluminum whose inner wall surface is anodized, and is grounded. A deposition shield 100 is detachably provided on the inner wall surface of the chamber 10.

The support part 11 is configured to support a substrate W in the processing space 10s. In this embodiment, the support part 11 includes a lower electrode 111, an electrostatic chuck 112, and an edge ring 113. The electrostatic chuck 112 is disposed on the lower electrode 111 and is configured to support the substrate W on the upper surface of the electrostatic chuck 112. The edge ring 113 is disposed so as to surround the substrate W on the upper surface of the peripheral edge portion of the lower electrode 111. A tubular ring shield 103 is provided on the outer peripheral surface of the lower electrode 111. A baffle plate sidewall 101 is provided on the inner wall of the chamber 10 facing the ring shield 103. A baffle plate 102 is provided between the ring shield 103 and the baffle plate sidewall 101.

A heater (not shown) is provided inside the electrostatic chuck 112. In addition, a flow path (not shown) is formed inside the lower electrode 111, and a medium whose temperature is controlled by a chiller unit (not shown) circulates in the flow path. The temperature of the substrate W placed on the electrostatic chuck 112 is controlled by the heater inside the electrostatic chuck 112 and the medium circulating in the flow path of the lower electrode 111. In this embodiment, the temperature of the substrate W is controlled to, for example, 20 degrees C. or lower during a process such as etching on the substrate W.

The upper electrode shower head assembly 12 is configured to supply one or more types of gases from the gas supply part 20 into the processing space 10s. In this embodiment, the upper electrode shower head assembly 12 includes a gas inlet 12a, a gas diffusion chamber 12b, and a plurality of gas outlets 12c. The gas supply part 20 and the gas diffusion chamber 12b are in fluid communication with each other through the gas inlet 12a. The gas diffusion chamber 12b and the processing space 10s are in fluid communication with each other through the plurality of gas outlets 12c. In the present embodiment, the upper electrode shower head assembly 12 is configured to supply one or more types of gases from the gas inlet 12a into the processing space 10s via the gas diffusion chamber 12b and the plurality of gas outlets 12c.

The gas supply part 20 includes a plurality of gas sources 21a to 21d and a plurality of flow rate controllers 22a to 22d. The flow rate controllers 22a to 22d may include, for example, a mass flow controller or a pressure-controlled flow rate controller. Further, the gas supply part 20 may include one or more flow rate modulation devices that modulate or pulse the flow rate of one or more process gases.

In this embodiment, the flow rate controller 22a controls the flow rate of the process gas supplied from the gas source 21a and supplies the process gas with the controlled flow rate to the gas inlet 12a. In this embodiment, the process gas includes a gas containing carbon. An example of the gas containing carbon may include a fluorocarbon gas. At least one of a $C_4F_6$ gas, a $C_4F_8$ gas, and a $C_5F_8$ gas may be included in the gas containing carbon. Further, the processing gas may include a gas containing hydrogen. An example of the gas containing hydrogen may include a hydrogen gas, a hydrocarbon gas, or the like. The processing gas is an example of a second gas.

The flow rate controller 22b controls the flow rate of a cleaning gas supplied from the gas source 21b and supplies the cleaning gas with the controlled flow rate to the gas inlet 12a. In this embodiment, the cleaning gas is, for example, an oxygen gas, an ozone gas, or the like. Further, a small amount of $CF_4$ or the like may be added to the cleaning gas. The cleaning gas is an example of a third gas.

The flow rate controller 22c controls the flow rate of a hydrocarbon gas supplied from the gas source 21c and supplies the hydrocarbon gas with the controlled flow rate to the gas inlet 12a. In this embodiment, the hydrocarbon gas is, for example, a methane ($CH_4$) gas.

The flow rate controller 22d controls the flow rate of a fluorocarbon gas supplied from the gas source 21d and supplies the fluorocarbon gas with the controlled flow rate to the gas inlet 12a. In this embodiment, the fluorocarbon gas is, for example, an octafluorocyclobutane ($C_4F_8$) gas. A mixture of the hydrocarbon gas supplied from the gas source 21c and the fluorocarbon gas supplied from the gas source 21d is an example of a first gas. The first gas may be a hydrocarbon gas that does not include a fluorocarbon gas, or may be a mixture of a fluorocarbon gas that does not include a hydrocarbon gas, and a gas containing hydrogen. The gas containing hydrogen may be, for example, a hydrogen gas or the like.

The RF power supply part 30 is configured to supply RF power, for example, one or more RF signals, to one or more electrodes such as the lower electrode 111, the upper electrode shower head assembly 12, or both the lower electrode 111 and the upper electrode shower head assembly 12. In this embodiment, the RF power supply part 30 includes two RF generation parts 31a and 31b and two matching circuits 32a and 32b. The RF power supply part 30 in this embodiment is configured to supply a first RF signal from the first RF generation part 31a to the lower electrode 111 via the first matching circuit 32a. The RF spectrum includes a portion of the electromagnetic spectrum in the range of 3 [Hz] to 3,000 [GHz]. For an electronic material process such as a semiconductor process, the frequency of the RF spectrum used for plasma generation may be in the range of specifically 100 [kHz] to 3 [GHz], more specifically 200 [kHz] to 150 [MHz]. For example, the frequency of the first RF signal may be in the range of 27 [MHz] to 100 [MHz]. In this embodiment, the lower electrode 111 functions as a cathode to which the first RF signal for plasma generation is supplied. On the other hand, for the first RF signal for plasma generation, the inner wall of the upper electrode shower head assembly 12 and the chamber 10 functions as an anode which is a counter electrode to the lower electrode 111.

Further, the RF power supply part 30 in this embodiment is configured to supply a second RF signal from the second RF generation part 31b to the lower electrode 111 via the second matching circuit 32b. For example, the frequency of the second RF signal may be in the range of 400 [kHz] to 13.56 [MHz]. Alternatively, a DC (Direct Current) pulse generation part may be used instead of the second RF generation part 31b Further, although not shown, other embodiments are considered here. For example, in the RF power supply part 30 of an alternative embodiment, it may be configured such that the RF generation part supplies the first RF signal to the lower electrode 111 and the other RF generation part supplies the second RF signal to the lower electrode 111. In addition, another RF generation part may be configured to supply a third RF signal to the upper electrode shower head assembly 12. In addition, in another alternative embodiment, a DC voltage may be applied to the upper electrode shower head assembly 12. Further, in various embodiments, the amplitude of one or more RF signals (i.e., the first RF signal, the second RF signal, and the like) may be pulsed or modulated. The amplitude modulation may include pulsing the amplitude of the RF signal between the ON-state and the OFF-state or between a plurality of different ON-states. Further, the phase matching of the RF signals may be controlled, and the phase matching of the amplitude modulation of the plurality of RF signals may be synchronized or asynchronous.

The exhaust system 40 may be connected to, for example, an exhaust port 10e provided at the bottom of the chamber 10. The exhaust system 40 may include a pressure valve and a vacuum pump such as a turbo molecular pump, a roughing pump, or a combination thereof.

In this embodiment, the controller 50 processes a computer-executable instruction to cause the plasma processing apparatus 1 to execute various steps to be described herein. The controller 50 may be configured to control various elements of the plasma processing apparatus 1 so as to perform the various steps to be described herein. The controller 50 may include, for example, a computer 51. The computer 51 includes, for example, a processing part (for example, a CPU; Central Processing Unit) 511, a storage part 512, and a communication interface 513. The processing part 511 may be configured to perform various control operations based on programs and recipes stored in the storage part 512. The storage part 512 may be at least one type of non-transitory computer-readable memory selected from the group consisting of various types of memories such as a RAM (Random Access Memory), a ROM (Read Only Memory), a HDD (Hard Disk Drive), a SSD (Solid State Drive) and the like. The communication interface 513 communicates with the plasma processing apparatus 1 via a communication line such as a LAN (Local Area Network).

[Selection of Protective Film]

Figures 2, 3:
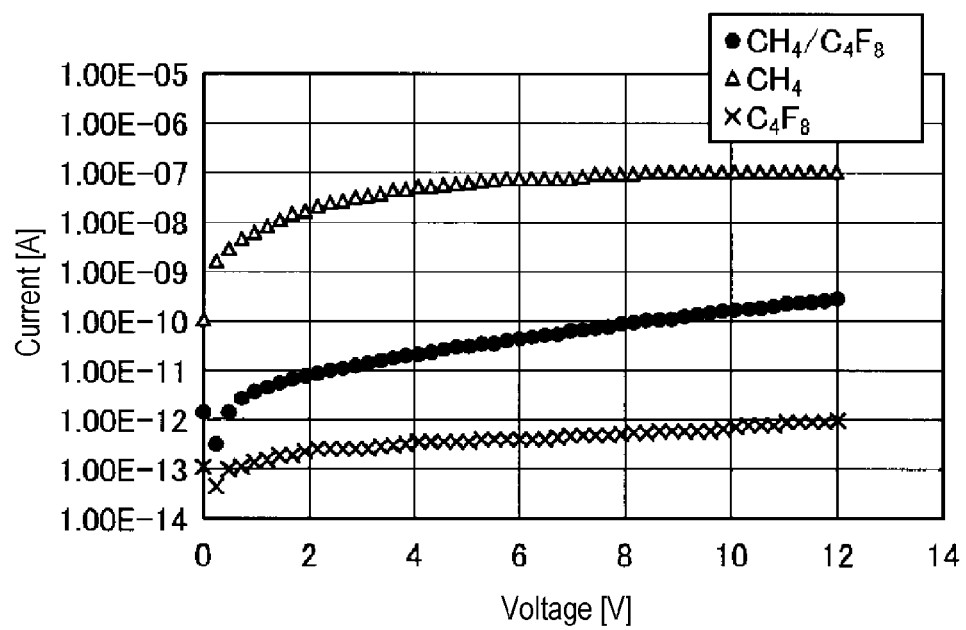
FIG. 2 is a diagram showing an example of characteristics of a film formed for each condition.
FIG. 3 is a diagram showing an example of voltage-current characteristics of the film.

FIG. 2 is a diagram showing an example of characteristics of a film formed for each condition. In each of conditions (1) to (5) shown in FIG. 2, the characteristics of a film formed on a silicon substrate using the plasma generated inside the chamber 10 mainly under the following conditions were evaluated.

Pressure: 100 [mTorr]
First RF: 1,000 [W]
Second RF: 200 [W]

Under the condition (1), a methane ($CH_4$) gas was used to form a film. In the film formed under the condition (1), the deposition rate (D/R) in the silicon substrate was 130 [nm/min]. Further, in the film formed under the condition (1), the film thickness that could be deposited was 400 [nm] or less. Further, in the film formed under the condition (1), the etching rate (E/R) when etching was performed under the following condition was 19 [nm/min]. It can be said that the lower the E/R, the higher the etching resistance of the protective film.

Pressure: 25 [mTorr]
First RF: 4,500 [W]
Second RF: 200 [W]
Etching gas: $H_2/C_4F_8/O_2$
Etching time: 120 seconds Further, when the protective film was formed on the surfaces of the components inside the chamber 10 under the condition (1), the uniformity of the thickness of the protective film was poor. The film formed under the condition (1) is not suitable as the protective film.

Under the condition (2), an octafluorocyclobutane ($C_4F_8$) gas was used to form a film. In the film formed under the condition (2), the deposition rate (D/R) in the silicon substrate was 233 [nm/min].

Under the condition (3), a hexafluorobutadiene ($C_4F_6$) gas was used to form a film. In the film formed under the condition (3), the deposition rate (D/R) in the silicon substrate was 1,000 [nm/min]. Further, in the film formed under the condition (3), the film thickness that could be deposited was 2,000 [nm] or more. However, the film formed under the condition (3) had poor adhesion to the silicon substrate to peel off the film easily. Further, the E/R of the film formed under the condition (3) was 102 [nm/min].

Under the condition (4), a mixture of a methane ($CH_4$) gas and a hexafluorobutadiene ($C_4F_6$) gas was used to form a film. Under the condition (4), these gases were mixed at a flow rate ratio in which a ratio of the $C_4F_6$ gas to the $CH_4$ gas was $CH_4:C4F_6=1:9$. In the film formed under the condition (4), the deposition rate (D/R) in the silicon substrate was 1,004 [nm/min].

Under the condition (5), a mixture of a methane ($CH_4$) gas and an octafluorocyclobutane ($C_4F_6$) gas was used to form a film. Under the condition (5), these gases were mixed at a flow rate ratio in which a ratio of the $C_4F_8$ gas to the $CH_4$ gas was $CH_4:C_4F_8=1:3$. In the film formed under the condition (5), the deposition rate (D/R) in the silicon substrate was 506 [nm/min]. Further, in the film formed under the condition (5), the film thickness that could be deposited was 2,000 [nm] or less. Further, the E/R of the film formed under the condition (5) was 91 [nm/min].

Here, when the protective film is formed on the surfaces of the components inside the chamber 10, the surfaces of the components inside the chamber 10 are exposed to plasma in the process of forming the protective film. Therefore, if the surfaces of the components inside the chamber 10 are exposed to the plasma for a long time, the surfaces of the components inside the chamber 10 are damaged. Therefore, it is preferable that the protective film having a desired thickness is formed in a short time. In order to form the protective film having a desired thickness in a short time, it is preferable that the D/R is high.

The film formed under the condition (5) has a relatively high D/R and a relatively low E/R as compared with the films formed under the other conditions. Therefore, among the films formed under the conditions illustrated in FIG. 2, the film formed under the condition (5) is most preferable.

[Minimum Film Thickness of Protective Film]

Even when the protective film is formed on the surfaces of the components inside the chamber 10, if the protective film is thin, ions and the like contained in the plasma penetrate the protective film and reach the surfaces of the components inside the chamber 10, which may damage to the surfaces of the components. Therefore, hydrogen, which is the smallest atom, was turned into plasma, and when the hydrogen ions contained in the plasma collided with the protective film, the depth of the hydrogen ions reached in the protective film was investigated.

In an experiment, a photoresist (PR) film, which is similar in material to the protective film, was exposed to hydrogen gas plasma. The potential of the plasma with respect to the inner wall of the chamber 10 was calculated to be about 100 [eV], which means that Vpp of the first RF signal corresponds to 200 [V].

When the PR film was exposed to the hydrogen gas plasma under this condition, the PR film from the surface of the PR film to a depth of about 20 [nm] was altered by the hydrogen ions contained in the plasma. That is, if the PR film has a thickness of 20 [nm] or more, the hydrogen ions contained in the hydrogen gas plasma do not penetrate the PR film. Therefore, it is preferable that the protective film having a material similar to that of the PR film is formed with a thickness of 20 [nm] or more on the surfaces of the components inside the chamber 10. This can prevent damage to the components inside the chamber 10 due to ions and the like contained in the plasma.

[Conductive Properties of Protective Film]

Figure 4:
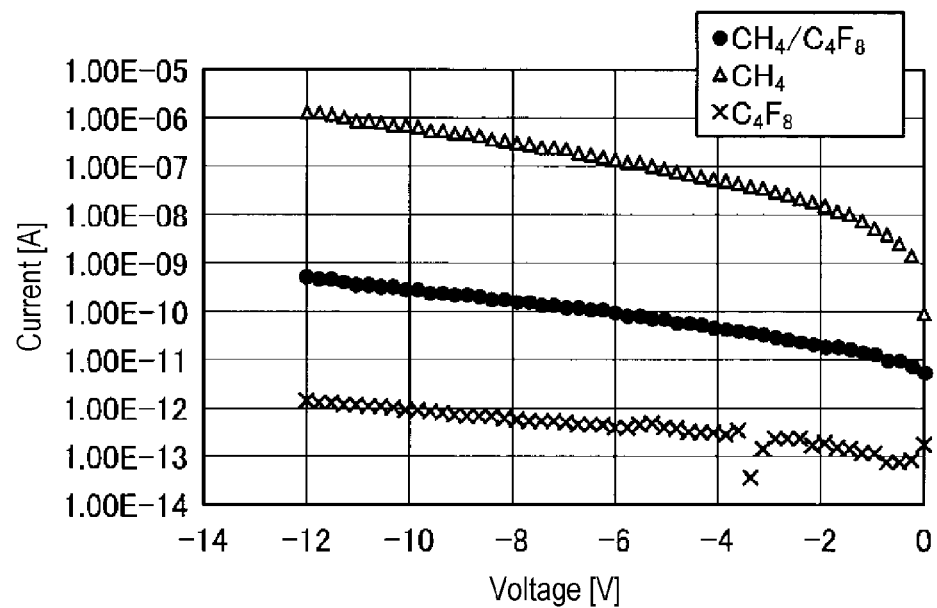
FIG. 4 is a diagram showing an example of voltage-current characteristics of the film.

FIGS. 3 and 4 are diagrams showing an example of voltage-current characteristics of a film. The resistance value of the film formed using both the $CH_4$ gas and the $C_4F_8$ gas is about $2 \times 10^{10} [\Omega]$ to $2 \times 10^{11} [\Omega]$. On the other hand, the resistance value of the film formed using the $C_4F_8$ gas without using the $CH_4$ gas is about $6 \times 10^{12} [\Omega]$ to $12 \times 10^{12} [\Omega]$, which is larger by over two orders of magnitude than the resistance value of the film formed using both the $CH_4$ gas and the $C_4F_8$ gas. The resistance value of the film formed using the $CH_4$ gas without using the $C_4F_8$ gas is about $1 \times 10^8 [\Omega]$ to $2 \times 10^8 [\Omega]$, which is smaller by over two orders of magnitude than the resistance value of the film formed using both the $CH_4$ gas and the $C_4F_8$ gas.

Referring to FIGS. 3 and 4, the resistance value of a film formed using a gas containing both carbon and hydrogen, such as the $CH_4$ gas, is lower than the resistance value of a film formed using a gas containing no hydrogen, such as the $C_4F_8$ gas. That is, the film formed using a gas containing both carbon and hydrogen, such as the $CH_4$ gas, shows conductive properties, and the film formed using a gas containing no hydrogen, such as the $C_4F_8$ gas, shows insulation.

Here, inside the chamber 10, there are electrodes that function as an anode and a cathode for the plasma generated inside the chamber 10. In order to exchange electrons with the plasma, such electrodes need to have conductive properties with the plasma.

However, if the protective film formed on the inner wall of the chamber 10 is an insulating film, the conductive properties between the plasma and the electrodes is lowered, which hinders the exchange of electrons with the plasma. As a result, the state of the plasma will be different from the state at the time of design. Therefore, the process becomes unstable and the gap between a process result and a desired result may increase. Therefore, in this embodiment, the conductive protective film is formed on the surfaces of the components inside the chamber 10 before the start of the process. As a result, it is possible to stabilize the process while preventing the consumption of the components inside the chamber 10.

[Composition of Protective Film]

Figure 5:
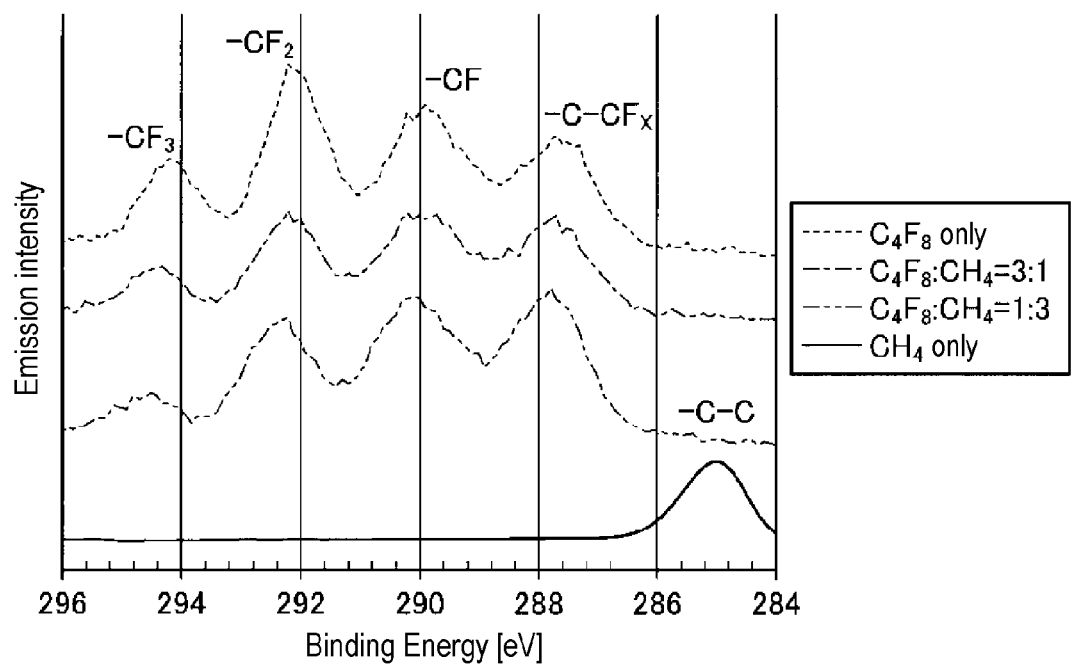
FIG. 5 is a diagram showing an example of a composition of the film.

FIG. 5 is a diagram showing an example of the composition of a film, which is the result obtained by observing the bonding state of carbon contained in the film by XPS (X-ray Photoelectron Spectroscopy). A film formed using only the $C_4F_8$ gas has a high peak in the bonding state with a high proportion of fluorine, such as a —$CF_2$ bond and a —$CF_3$ bond, whereas a film formed using both the $CH_4$ gas and the $C_4F_8$ gas tends to decrease the peak of the bonding state with a high proportion of fluorine and increase the peak of the bonding state with a low proportion of fluorine, such as a —CF bond and a —C—$CF_X$ bond. The higher the ratio of the $CH_4$ gas to the $C_4F_8$ gas, the higher the peak of the bonding state with a smaller proportion of fluorine.

It is considered that this is because fluorine (F) contained in a CF polymer generated by plasma of the $C_4F_8$ gas is extracted by scavenging reaction with hydrogen (H) generated by plasma of the $CH_4$ gas, so that a film is formed as a CF polymer having the low fluorine content. Therefore, in the embodiment, the $CH_4$ gas is used for the $C_4F_8$ gas, but it is considered that the same effects can be obtained if a gas containing hydrogen, such as a hydrogen gas or a hydrofluorocarbon gas, is used for the fluorocarbon gas. Further, since the composition of the $CH_4$ gas does not contain fluorine, the film formed using only the $CH_4$ gas does not contain fluorine and has only the —C—C bond.

Further, when the hydrofluorocarbon gas such as a $CH_2F_2$ gas is used instead of the fluorocarbon gas, the amount of fluorine contained in the gas is small, and hydrogen is contained in the gas. Therefore, it is expected that a film will be formed as a CF polymer having the low fluorine content without using a gas containing hydrogen. Further, by using the gas containing hydrogen, it can be expected that a film will be formed as a CF polymer having the lower fluorine content.

In general, a fluorine resin containing a large amount of fluorine atoms, such as polytetrafluoroethylene (PTFE), is a dielectric and has very low conductive properties, but graphite composed only of carbon is an isotope and has very high conductive properties. This is consistent with the tendency that a film formed using a gas containing both carbon and hydrogen, such as the $CH_4$ gas having a high proportion of —C—$CF_X$ bond or C—C bond, shows conductive properties and a film formed using a gas containing no hydrogen, such as the $C_4F_8$ gas having a high proportion of —$CF_2$ bond and —$CF_3$ bond, shows insulation.

[Deposition of Reaction by-Products]

Figure 6:
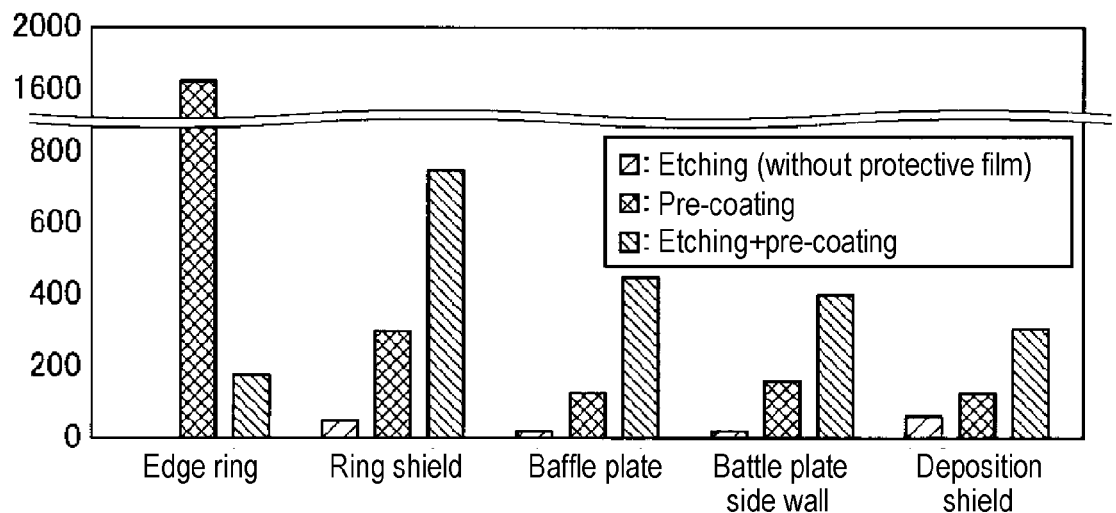
FIG. 6 is a diagram showing an example of a thickness of a protective film formed in each part inside a chamber.

FIG. 6 is a diagram showing an example of the thickness of the protective film formed in each part inside the chamber 10. FIG. 6 shows the thickness of deposits in each part in each of a case where etching is executed in a state where a protective film is not formed, a case where pre-coating is performed to form a protective film, and a case where etching is executed in a state where a protective film is formed.

In the etching, the substrate W placed on the electrostatic chuck 112 is etched by plasma generated under the following condition A, and then is further etched by plasma generated under the following condition B.

<Condition>
Pressure: 20 [mTorr]
First RF: 5,000 [W]
Second RF: 9,000 [W]
Etching gas: $H_2/C_4F_8/O_2$
Etching time: 1,200 seconds In the pre-coating, a protective film was formed inside the chamber 10 by plasma generated under the following condition.

Pressure: 100 [mTorr]
First RF: 1,000 [W]
Second RF: 200 [W]
Etching gas: $CH_4:C_4F_8=1:2$
Etching time: 180 seconds Referring to FIG. 6, in the edge ring 113, no deposits remained after etching in the absence of the protective film, but when the protective film was formed, deposits remained after etching. It is therefore presumed that the deposits function as a protective film of the edge ring 113.

Further, in the ring shield 103, the baffle plate 102, the baffle plate sidewall 101, and the deposition shield 100, deposits adhered after etching even in the absence of the protective film, but when the protective film was formed, the amount of deposits after etching tends to increase. Therefore, it is considered that the members inside the chamber 10 are protected by forming the protective film before etching even in the ring shield 103, the baffle plate 102, the baffle plate sidewall 101, and the deposition shield 100.

[Plasma Processing Method]

Figure 7:
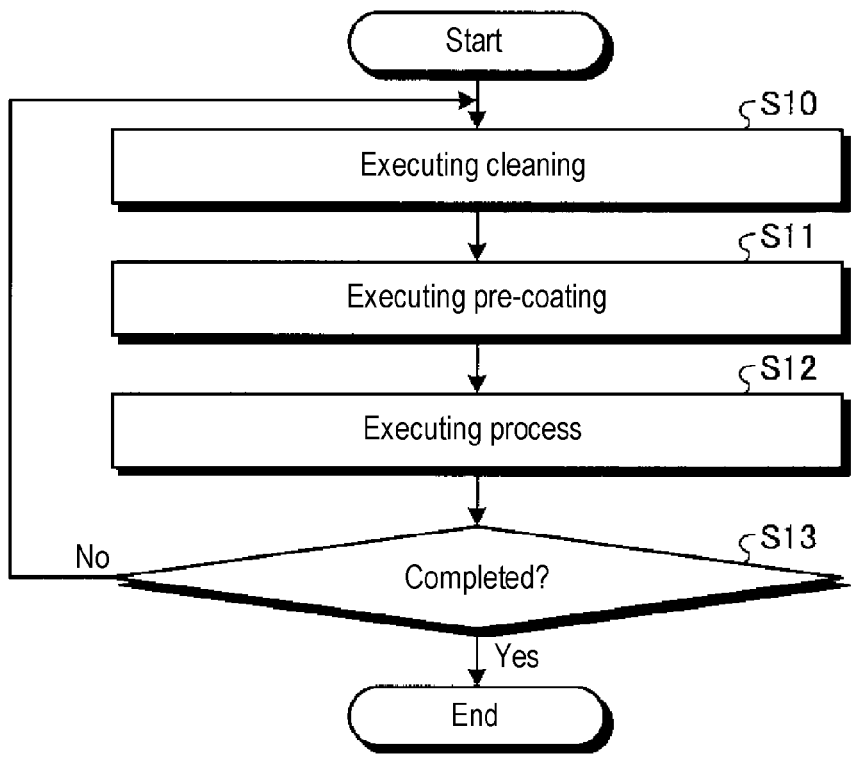
FIG. 7 is a flowchart showing an example of a plasma processing method.

FIG. 7 is a flowchart showing an example of a plasma processing method. The plasma processing method illustrated in FIG. 7 is started at a predetermined timing, for example, when a process such as etching is first executed after installation of the plasma processing apparatus 1, or when a process such as etching is executed after maintenance of the plasma processing apparatus 1. The plasma processing method illustrated in FIG. 7 is implemented, for example, by causing the processing part 511 to execute a program or the like stored in the storage part 512 and control each part of the plasma processing apparatus 1.

First, cleaning is executed (S10). The step S10 is an example of a removing step. In the step S10, a gate valve (not shown) is first opened, and a dummy wafer, instead of the substrate W, is loaded into the chamber 10 by a transfer device (not shown), and placed on the electrostatic chuck 112. Then, in the state in which the dummy wafer is loaded into the chamber 10, the processing part 511 controls the exhaust system 40 to exhaust a gas from the chamber 10. Then, the processing part 511 controls the flow rate controller 22b to supply a cleaning gas having a desired flow rate into the chamber 10 and adjust the internal pressure of the chamber 10. Then, the processing part 511 controls the first RF power supply part 30a to supply the first RF signal to the lower electrode 111. The cleaning gas supplied in the form of a shower from the upper electrode shower head assembly 12 to the processing space 10s is turned into plasma by the first RF signal supplied from the first RF power supply part 30a to the lower electrode 111. Then, foreign substances adhering to the surfaces of the components inside the chamber 10 are removed by radicals and the like contained in the plasma. In the cleaning, the second RF signal may be supplied from the second RF power supply part 30b to the lower electrode 111. Further, the step S10 may be executed without the dummy wafer and the substrate W inside the chamber 10.

Next, pre-coating is executed to form a protective film inside the chamber 10 (S11). The step S11 is an example of a coating step. In the step S11, the processing part 511 controls the exhaust system 40 to exhaust a gas from the chamber 10 while the dummy wafer, instead of the substrate W, is kept inside the chamber 10. Then, the processing part 511 controls the flow rate controller 22c to supply a $CH_4$ gas having a desired flow rate into the chamber 10 and controls the flow rate controller 22d to supply a $C_4F_6$ gas having a desired flow rate into the chamber 10 and adjust the internal pressure of the chamber 10. As a result, a gas including the $CH_4$ gas and the $C_4F_6$ gas is supplied from the upper electrode shower head assembly 12 into the processing space 10s. Then, the processing part 511 controls the first RF power supply part 30a and the second RF power supply part 30b to supply the first RF signal and the second RF signal, respectively, to the lower electrode 111. The gas supplied in the form of a shower from the upper electrode shower head assembly 12 into the processing space 10s is turned into plasma by the first RF signal supplied from the first RF power supply part 30a to the lower electrode 111. Then, a protective film having conductive properties is formed on the surfaces of the components inside the chamber 10 by ions, radicals and the like contained in the plasma. Further, the second RF signal supplied from the second RF power supply part 30b to the lower electrode 111 applies a bias to the substrate W and at the same time increases the plasma potential. As the plasma potential increases, ions contained in the plasma are attracted to the surfaces of the components inside the chamber 10, and fluorine contained in the protective film formed on the surfaces of the components inside the chamber 10 is extracted by the sputtering effect. As a result, the protective film formed on the surfaces of the components inside the chamber 10 has a high proportion of carbon, which may enhance the conductive properties of the protective film.

Further, if the process can be performed under the condition that the protective film is not formed or is reduced on the electrostatic chuck 112, the step S11 may be executed without the dummy wafer and the substrate W inside the chamber 10. Further, when the dummy wafer is used in the steps S11 and S12, before the next step S12 is executed, the gate valve (not shown) is opened and the dummy wafer is unloaded from the chamber 10 by the transfer device (not shown).

Next, a process such as etching is executed (S12). The step S12 is an example of a processing step. In the step S12, the gate valve (not shown) is opened, and the substrate W is loaded into the chamber 10 by the transfer device (not shown), and placed on the electrostatic chuck 112. Then, the processing part 511 controls the exhaust system 40 to exhaust a gas from the chamber 10 and controls the flow rate controller 22a to supply a process gas having a desired flow rate into the chamber 10 and adjust the internal pressure of the chamber 10. Then, the processing part 511 controls the first RF power supply part 30a and the second RF power supply part 30b to supply the first RF signal and the second RF signal, respectively, to the lower electrode 111. The process gas supplied in the form of a shower from the upper electrode shower head assembly 12 into the processing space 10s is turned into plasma by the first RF signal supplied from the first RF power supply part 30a to the lower electrode 111. Then, ions and the like contained in the plasma are attracted to the substrate W by the second RF signal supplied from the second RF power supply part 30b to the lower electrode 111. As a result, the substrate W is etched by ions, radicals, and the like contained in the plasma. Further, in the step S11, reaction by-products are deposited on the protective film formed on the surfaces of the components inside the chamber 10. When the execution of the process such as etching is completed, the gate valve (not shown) is opened, and the substrate W is unloaded from the chamber 10 by the transfer device (not shown).

Next, the processing part 511 determines whether or not a process for a predetermined number of substrates W has been completed (S13). The predetermined number may be, for example, 1, or 2 or more. When the process for the predetermined number of substrates W has not been completed ("No" in S13), the processing part 511 again executes the process shown in the step S10. As the process shown in the step S10 is executed again, the protective film formed in the step S11 and the reaction by-products deposited on the protective film in the step S12 are removed. After the protective film and the reaction by-products have been removed, the steps S11 and S12 are executed again to continue the process for the substrate W.

When the process processing method for the predetermined number of substrates W has been completed ("Yes" in S13), the plasma processing method is completed. Further, although not shown in FIG. 7, before completing the process processing method, the processing part 511 may perform the cleaning again under the same conditions as in the step S10. As the process is executed again under the same conditions as in the step S10, the protective film formed in the step S11 and the reaction by-products deposited on the protective film in the step S12 are removed, and since the protective film and foreign substances have been removed from the surfaces of the components inside the chamber 10 until the process processing method is executed again, generation of particles due to peeling of the protective film and foreign substances is suppressed.

[Process Stability]

FIG. 8 is a diagram showing an example of a ratio of change in E/R with respect to E/R in an initially executed etching.

If no protective film is formed on the surfaces of the components inside the chamber 10, the components inside the chamber 10 may be damaged by the plasma when the etching is executed. Accordingly, the components inside the chamber 10 are consumed and the environment in the chamber 10 gradually changes. In addition, particles generated from the consumed components adhere to other components and change their electrical characteristics. Therefore, when the E/R in an initially executed etching is used as a reference, the E/R gradually changes as the cumulative etching time increases. In the example of FIG. 7, the E/R at the cumulative etching time of 400 [min] changes by 40% or more from the E/R in an initially executed etching.

In contrast, when the protective film is formed on the surfaces of the components inside the chamber 10, the components inside the chamber 10 are less likely to be damaged by the plasma even when the etching is executed. Accordingly, the consumption of the components inside the chamber 10 is suppressed and the change in the environment in the chamber 10 is suppressed. Further, since the consumption of the components inside the chamber 10 is suppressed, the particles generated from the components inside the chamber 10 are also reduced, and the change in the electrical characteristics of the components inside the chamber 10 is suppressed. Therefore, when the E/R in an initially executed etching is used as a reference, the change in the E/R is suppressed even when the cumulative etching time is long. In the example of FIG. 7, when the cumulative etching time is 400 [min], the amount of change in E/R was suppressed to about 6% from the E/R in an initially executed etching.

The embodiment has been described above. As described above, the plasma processing method in the present embodiment is a plasma processing method of processing the substrate W with plasma, and includes a step of coating the surfaces of the components inside the chamber 10 with the protective film having conductive properties by turning the first gas containing carbon and hydrogen into plasma in the chamber 10, a step of loading the substrate W into the chamber 10, and a step of processing the substrate W by turning the second gas into plasma inside the chamber 10 in the state where the surfaces of the components inside the chamber 10 are coated with the protective film having conductive properties. As a result, it is possible to stabilize the process while suppressing the consumption of the components inside the chamber 10.

Further, in the coating step in the above-described embodiment, the conductive protective film is formed with the thickness of 20 [nm] or more on the surfaces of the components inside the chamber 10. As a result, it is possible to prevent the components inside the chamber 10 from being damaged due to ions and the like contained in the plasma.

Further, the plasma processing method in the above-described embodiment further includes, after the processing step, a step of removing the conductive protective film by turning the third gas containing oxygen into plasma inside the chamber 10. Further, after the removing step is executed, the coating step is executed again, and then the processing step is executed. As a result, the reaction by-products deposited on the protective film can be removed, the damaged protective film can be removed, and a new protective film can be formed on the surfaces of the components inside the chamber 10.

Further, in the above-described embodiment, the first gas includes a hydrocarbon gas, a hydrofluorocarbon, a mixture of a fluorocarbon gas and a gas containing hydrogen, or a mixture of a hydrofluorocarbon gas and a gas containing hydrogen. The gas containing hydrogen includes a hydrogen gas, a hydrocarbon gas, or a hydrofluorocarbon gas. As a result, the surfaces of the components inside the chamber 10 can be coated with the protective film having conductive properties.

Further, in the above-described embodiment, the second gas includes a fluorocarbon gas. The second gas may include at least one of a $C_4F_6$ gas, a $C_4F_8$ gas, and a $C_5F_8$ gas. Further, the second gas includes a gas containing hydrogen. The gas containing hydrogen includes a hydrogen gas, a hydrocarbon gas, or a hydrofluorocarbon gas. As a result, the conductive reaction by-products are deposited on the surfaces of the components inside the chamber 10 on which the conductive protective film is formed, so that the change in the environment inside the chamber 10 is suppressed. Therefore, process stabilization can be implemented.

[Others]

The technique described herein is not limited to the above-described embodiments, but many modifications can be made within the scope of the gist thereof.

For example, in each of the above-described embodiments, the plasma processing apparatus 1 that performs a process using capacitively-coupled plasma (CCP) as an example of the plasma source has been described, but the plasma source is not limited thereto. Examples of plasma sources other than the capacitively-coupled plasma may include inductively-coupled plasma (ICP), microwave excited surface wave plasma (SWP), electron cyclotron resonance plasma (ECP), helicon wave excited plasma (HWP), and the like.

According to the present disclosure in some embodiments, it is possible to implement process stabilization while suppressing consumption of components inside a chamber.

It should be noted that the embodiments described herein are exemplary in all respects and are not restrictive. Indeed, the above-described embodiments may be implemented in various forms. Further, the above-described embodiments may be omitted, replaced or modified in various forms without departing from the scope and spirit of the appended claims.

What is claimed is:

1. A plasma processing apparatus comprising:
a chamber including at least one gas inlet and at least one gas outlet;
a substrate support in the chamber;
chamber components in the chamber;
a plasma generator; and
a controller configured to perform:
(a) coating surfaces of the chamber components with a protective film by forming a first gas containing carbon and hydrogen into a first plasma in the chamber;
(b) placing a substrate on the substrate support;
(c) processing the substrate by forming a second gas into a second plasma in the chamber;
(d) removing, after (c), the protective film by forming a third gas containing oxygen into a third plasma in the chamber; and
(e) repeating (a)-(d) with respect to a plurality of substrates.

2. The plasma processing apparatus of claim 1, wherein in the coating, the protective film is formed with a thickness of 20 nm or more on the surfaces of the chamber components.

3. The plasma processing apparatus of claim 1, wherein the first gas includes a hydrocarbon gas, a hydrofluorocarbon gas, a mixture of a fluorocarbon gas and a gas containing hydrogen, or a mixture of a hydrofluorocarbon gas and a gas containing hydrogen.

4. The plasma processing apparatus of claim 3, wherein the gas containing hydrogen includes a hydrogen gas, a hydrocarbon gas, or a hydrofluorocarbon gas.

5. The plasma processing apparatus of claim 1, wherein the second gas includes a fluorocarbon gas.

6. The plasma processing apparatus of claim 5, wherein the second gas includes at least one selected from the group consisting of a $C_4F_6$ gas, a $C_4F_8$ gas, and a $C_5F_8$ gas.

7. The plasma processing apparatus of claim 5, wherein the second gas further includes a gas containing hydrogen.

8. The plasma processing apparatus of claim 7, wherein the gas containing hydrogen includes a hydrogen gas, a hydrocarbon gas, or a hydrofluorocarbon gas.

9. The plasma processing apparatus of claim 1, wherein the plasma generator includes capacitively-coupled plasma, inductively-coupled plasma, microwave excited surface wave plasma, electron cyclotron resonance plasma, or helicon wave excited plasma, as a plasma source.

10. The plasma processing apparatus of claim 1, wherein the protective film has conductive properties.

11. A plasma processing apparatus comprising:
a chamber including at least one gas inlet and at least one gas outlet;
a substrate support in the chamber;
chamber components in the chamber;
a plasma generator; and
a controller configured to perform:
(a) coating surfaces of the chamber components with a protective film by forming a first gas containing carbon and hydrogen into a first plasma in the chamber;
(b) placing a substrate on the substrate support;
(c) processing the substrate by forming a second gas into a second plasma in the chamber;
(d) repeating (b) and (c) with respect to a plurality of substrates;
(e) removing, after (d), the protective film by forming a third gas containing oxygen into a third plasma in the chamber; and
(f) repeating (a)-(e).

12. The plasma processing apparatus of claim 11, wherein the protective film has conductive properties.

13. The plasma processing apparatus of claim 11, wherein a resistance value of the protective film is $2\times10^{10}\Omega$ or more and $2\times10^{11}\Omega$ or less.

14. The plasma processing apparatus of claim 11, wherein a resistance value of the protective film is $1\times10^{8}\Omega$ or more and $2\times10^{8}\Omega$ or less.

15. The plasma processing apparatus of claim 11, wherein the substrate support includes a lower electrode, and
wherein the chamber includes an upper electrode that forms a portion of a ceiling of the chamber and faces the lower electrode.

16. The plasma processing apparatus of claim 15, further comprising an RF power supply configured to supply one or more RF signals to the upper electrode and/or the lower electrode.

17. The plasma processing apparatus of claim 16, wherein the RF power supply includes:
a first RF power supply configured to supply a first RF signal for plasma generation; and
a second RF power supply configured to supply a second RF signal for bias generation.

18. The plasma processing apparatus of claim 17, wherein the controller is configured to control the second RF power supply to supply the second RF signal to the substrate support, in (a).

19. The plasma processing apparatus of claim 15, further comprising a direct current supply connected to the lower electrode.

* * * * *